(12) United States Patent
Mihara

(10) Patent No.: US 7,550,833 B2
(45) Date of Patent: Jun. 23, 2009

(54) SEMICONDUCTOR DEVICE HAVING A SECOND SEMICONDUCTOR CONSTRUCTION MOUNTED ON A FIRST SEMICONDUCTOR CONSTRUCTION AND A MANUFACTURING METHOD THEREOF

(75) Inventor: Ichiro Mihara, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 70 days.

(21) Appl. No.: 11/302,593

(22) Filed: Dec. 12, 2005

(65) Prior Publication Data

US 2006/0125072 A1 Jun. 15, 2006

(30) Foreign Application Priority Data

Dec. 14, 2004 (JP) .............................. 2004-361054

(51) Int. Cl.
*H01L 23/02* (2006.01)
*H01L 23/48* (2006.01)

(52) U.S. Cl. .............................. 257/686; 257/E23.178; 257/E25.013; 257/E21.705; 257/E23.079; 257/E23.114; 257/737; 257/758; 257/723; 257/724; 257/738; 257/734; 257/777; 257/778; 257/775; 257/776

(58) Field of Classification Search ................. 257/686, 257/E23.178, E25.013, 737, E21.705, 685, 257/758, 723, 724, 738, 734, 777, 778, 775, 257/776, E23.079, E23.114
See application file for complete search history.

(56) References Cited

U.S. PATENT DOCUMENTS

| | | | |
|---|---|---|---|
| 7,042,081 B2* | 5/2006 | Wakisaka et al. ........... | 257/700 |
| 7,064,440 B2* | 6/2006 | Jobetto et al. ............... | 257/758 |
| 7,075,181 B2* | 7/2006 | Wakabayashi et al. ...... | 257/734 |
| 7,256,496 B2* | 8/2007 | Okada et al. ................ | 257/737 |
| 7,368,813 B2* | 5/2008 | Wakisaka et al. ........... | 257/690 |
| 2005/0062147 A1* | 3/2005 | Wakisaka et al. ........... | 257/712 |
| 2005/0269698 A1* | 12/2005 | Okada et al. ................ | 257/737 |
| 2006/0244136 A1* | 11/2006 | Mihara ........................ | 257/734 |
| 2007/0069272 A1* | 3/2007 | Wakabayashi et al. ...... | 257/310 |
| 2007/0126127 A1* | 6/2007 | Jobetto et al. ............... | 257/780 |
| 2007/0126128 A1* | 6/2007 | Jobetto et al. ............... | 257/780 |
| 2007/0232061 A1* | 10/2007 | Okada et al. ................ | 438/628 |
| 2008/0020513 A1* | 1/2008 | Jobetto ........................ | 438/113 |
| 2008/0044944 A1* | 2/2008 | Wakisaka et al. ........... | 438/106 |
| 2008/0166836 A1* | 7/2008 | Jobetto ........................ | 438/109 |

FOREIGN PATENT DOCUMENTS

| | | | |
|---|---|---|---|
| JP | 2001-217381 A | 8/2001 | |
| JP | 2001-257310 A | 9/2001 | |
| JP | 2001-298149 A | 10/2001 | |

(Continued)

*Primary Examiner*—Alexander O Williams
(74) *Attorney, Agent, or Firm*—Frishauf, Holtz, Goodman & Chick, P.C.

(57) ABSTRACT

A semiconductor device comprises a plurality of semiconductor constructions being mutually laminated each having a semiconductor substrate and a plurality of external connection electrodes arranged on the semiconductor substrate respectively, an insulating layer formed around the peripheries of the semiconductor constructions, an upper layer insulating film formed on an uppermost one of the semiconductor constructions and the insulating layer, and upper layer wirings arranged on the upper layer insulating film by electrically connecting to the external connection electrodes of semiconductor constructions.

12 Claims, 17 Drawing Sheets

FOREIGN PATENT DOCUMENTS

| | | |
|---|---|---|
| JP | 2003-051569 A | 2/2003 |
| JP | 2003-504849 A | 2/2003 |
| JP | 2004-071998 A | 3/2004 |
| JP | 2004-111656 A | 4/2004 |
| JP | 2005-150344 * | 6/2005 |
| WO | WO 01/03189 A1 | 1/2001 |

* cited by examiner

SEMICONDUCTOR DEVICE HAVING A SECOND SEMICONDUCTOR CONSTRUCTION MOUNTED ON A FIRST SEMICONDUCTOR CONSTRUCTION AND A MANUFACTURING METHOD THEREOF

CROSS-REFERENCE TO RELATED APPLICATION

This application is based upon and claims the benefit of priority from the prior Japanese Patent Application No. 2004-361054, filed Dec. 14, 2004, the entire contents of which is incorporated herein by reference.

BACKGROUND OF THE INVENTION

1. Field of the Invention

The present invention relates to a semiconductor device having laminated semiconductor constructions and a manufacturing method thereof.

2. Description of the Related Art

A conventional semiconductor device where multiple semiconductor chips are laminated on the center of an upper surface of a circuit substrate and integrally packaged in order to reduce an area for mounting is known. This type of semiconductor device is described in the Publication of Japanese Patent Application Laid-Open No. 2004-111656. In this publication, upper side semiconductor chips are mounted to expose the connection pads of the semiconductor chips arranged at the lower side. In addition, the connection pads arranged around the periphery of each semiconductor chip and the connection pads arranged around the upper surface of the periphery of the circuit substrate are connected by bonding wire.

However, in the conventional semiconductor device, in order to enable the wire bonding of the semiconductor chips at the lower side, the size of the upper side semiconductor chips is smaller than that of the lower side semiconductor chips. As a result, the arrangement position of the connection pads arranged around the upper surface periphery of the upper side semiconductor chips is inside that of the connection pads arranged around the upper surface periphery of the lower side semiconductor chips. Further, because wire bonding is accomplished on the upper side semiconductor chips after being accomplished on the lower side semiconductor chips, the connection pads for the lower side semiconductor chips are arranged outside of the arrangement region of the lower side semiconductor chips on the upper surface of the circuit substrate and the connection pads for the upper side semiconductor chips are arranged outside of the lower side semiconductor chips.

As described above, in the conventional semiconductor device, because the connection pads for the lower side semiconductor chips are arranged outside of the arrangement region of the lower side semiconductor chips on the upper surface of the circuit substrate and the connection pads for the upper side semiconductor chips are arranged outside of the connection pads for the lower side semiconductor chips, the area of the circuit substrate, i.e. the area of the semiconductor device becomes comparatively larger and there is the problem that the area for mounting cannot be reduced very much.

Further, the distance between the connection pad of the upper side semiconductor chip and the connection pad for the upper side semiconductor chip on the circuit substrate becomes comparatively longer and in proportion to which the length of bonding wire for connecting both the connection pads is increased. When the diameter of bonding wire made of gold becomes comparatively larger, the cost becomes more expensive. As a result, the diameter of the bonding wire is comparatively small under normal conditions. Therefore, the inductance or impedance becomes greater and the device will not be suitable for high frequency.

SUMMARY OF THE INVENTION

The object of the present invention is to provide a semiconductor device and a manufacturing method thereof which enables an even smaller area for mounting and which is suitable for high frequencies because the length of wirings can be the shortest.

In order to achieve the above-mentioned object, a semiconductor device according to the present invention comprises a plurality of semiconductor constructions being mutually laminated each having a semiconductor substrate and a plurality of external connection electrodes arranged on the semiconductor substrate respectively; an insulating layer formed around the peripheries of the semiconductor constructions; an upper layer insulating film formed on an uppermost one of the semiconductor constructions and the insulating layer; and upper layer wirings arranged on the upper layer insulating film by electrically connecting to the external connection electrodes of semiconductor constructions.

Also, in order to achieve the above-mentioned object, a manufacturing method for semiconductor devices according to the present invention comprises preparing a base plate; preparing a plurality of first semiconductor constructions each having a semiconductor substrate and external connection electrodes arranged around the periphery of the semiconductor substrate respectively; arranging the first semiconductor constructions on the base plate with mutual separation; preparing a plurality of second semiconductor constructions each having a semiconductor substrate, external connection electrodes arranged around the periphery of the semiconductor substrate, and a plane size each of which is smaller than that of each of the first semiconductor constructions; arranging one of the second semiconductor constructions on/over each of the first semiconductor constructions, respectively; forming an insulating film around peripheries of the first and second semiconductor constructions on the base plate and on the second semiconductor construction, respectively; forming upper layer wirings on the insulating film, which is electrically connected to the external connection electrodes of the first and second semiconductor constructions; and cutting off the insulating film and the base plate between the first semiconductor constructions so as to obtain semiconductor devices where the first and second semiconductor constructions are laminated and provided on the base plate.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Embodiments of the present invention are described hereafter with reference to the drawings.

A. First Embodiment

Figure 1:
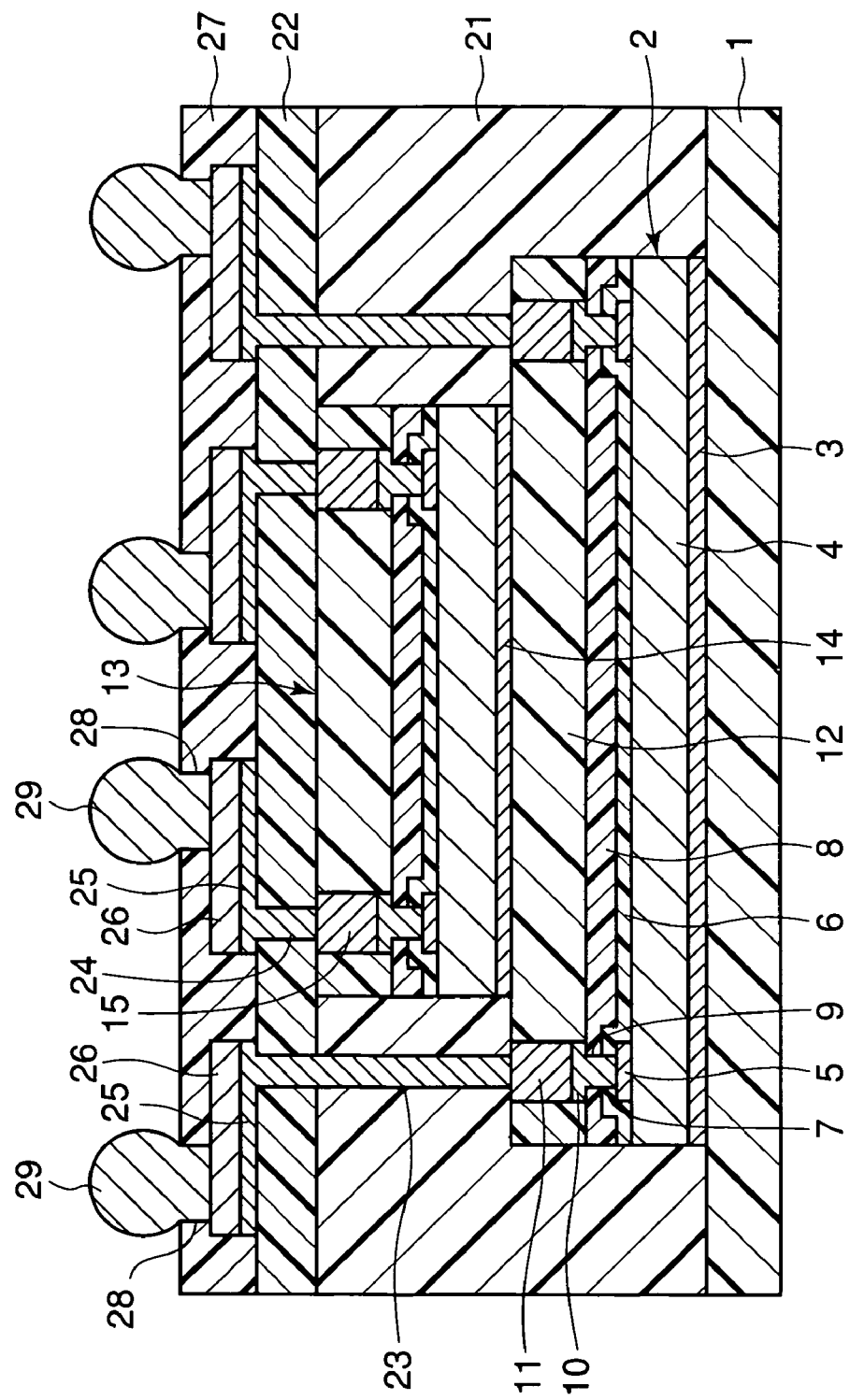
FIG. 1 is a cross-sectional view of a semiconductor device of the first embodiment of the present invention.

FIG. 1 shows a cross-sectional view of a semiconductor device as the first embodiment of the present invention. This semiconductor device is equipped with a square plane base plate 1 made of a glass fabric base epoxy resin. A lower surface of a square plane first semiconductor construction 2 with a smaller size in comparison with the size of the base 1 to some extent is adhered onto the upper surface of the base plate 1 via an adhesion layer 3 made of a die bond material.

The first semiconductor construction 2 comprises a silicon substrate (semiconductor substrate). An integrated circuit (not shown) with a pre-determined function(s) is provided on the upper surface of the silicon substrate 4, and connection pads 5 made from aluminum-base metal and connecting to the integrated circuit are arranged around the periphery on the upper surface. An insulating film 6 made of silicon oxide is arranged on the upper surface of the silicon substrate 4 except for the center portions of the connection pads 5. The center portions of the connection pads 5 are exposed via openings 7 formed in the insulating film 6.

A protective film 8 formed from epoxy resin or polyimide resin is provided on the upper surface of the insulating film 6. In this case, openings 9 are formed in portions of the protective film 8 corresponding to the openings 7 in the insulating film 6. A substrate metal layer 10 made of copper is formed on the upper surface of the protective film 8 by connecting to the connection pads 5 via both openings 7 & 9. Columnar electrodes (external connection electrodes) 11 made of copper are provided on the entire upper surface of the substrate metal layer 10. A sealing film 12 made of epoxy resin or polyimide resin is provided on the upper surface of the protective film 8 to make the upper surface of the sealing film 12 and the upper surface of the columnar electrodes 11 to be the same plane.

A lower surface of second semiconductor construction 13 formed in the shape of a square plane is adhered onto the center of the upper surface of the first semiconductor construction 2 via an adhesive layer 14 made of a die bond material. The plane size of the second semiconductor construction 13 is merely smaller than that of the first semiconductor construction 2 to some extent and since the basic construction thereof is the same as that of the first semiconductor construction 2, the detailed description is omitted.

Figure 2:
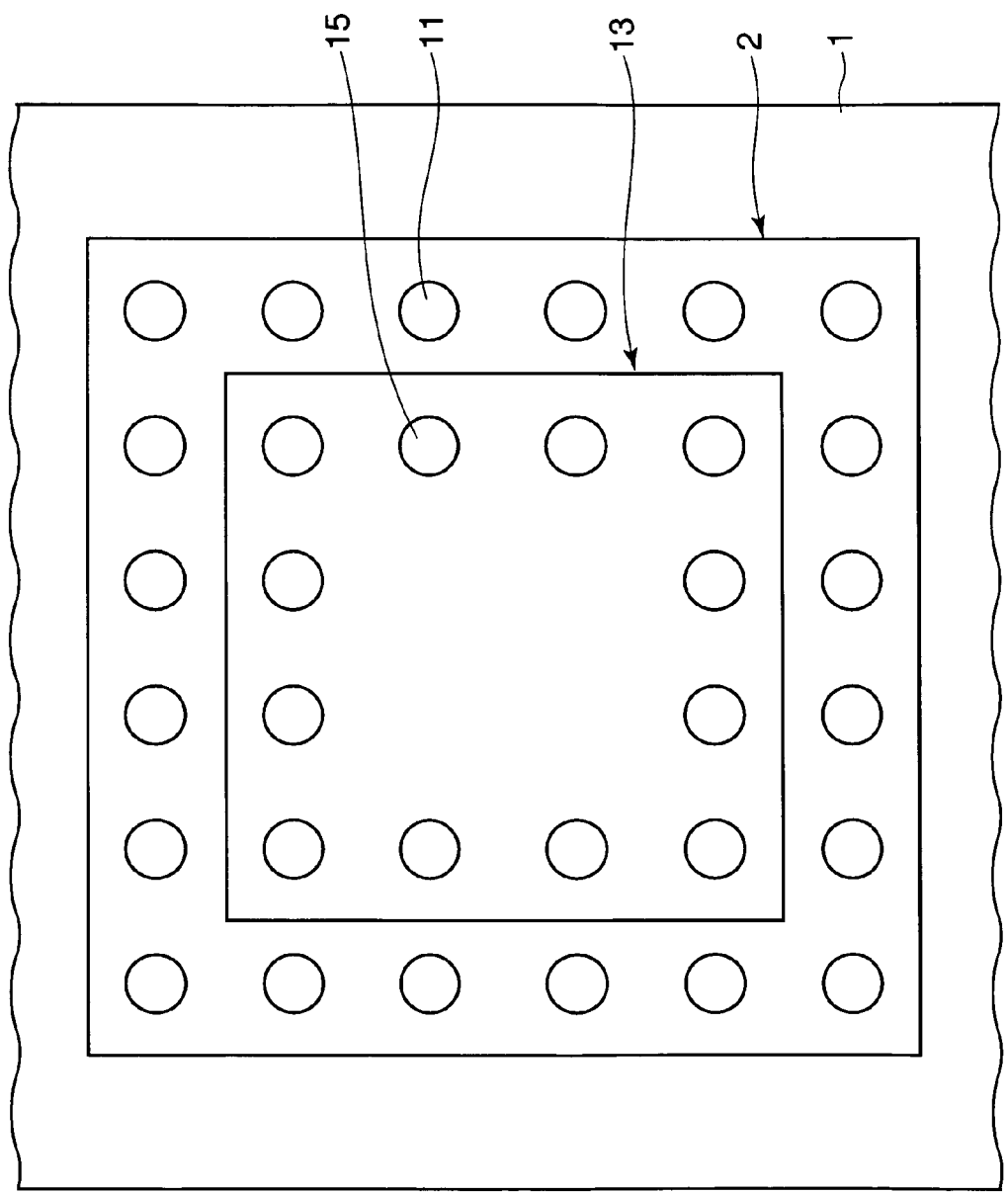
FIG. 2 is a top view showing a state in which the first and second semiconductor constructions are laminated and arranged.

Here, FIG. 2 shows a top view showing a situation where the first and second constructions 2 and 13 are laminated and arranged on the upper surface of the base plate 1. The columnar electrodes 11 arranged around the periphery on the upper surface of the first semiconductor construction 2 formed in the shape of a square plane are arranged outside of the square plane second semiconductor construction 13 in this state. Further, the columnar electrodes 15 are arranged around the periphery on the upper surface of the second semiconductor construction 13 formed in the shape of a square plane. Furthermore, the first and second semiconductor constructions 2 and 13 can be formed in the shape of rectangular planes.

Going back to FIG. 1 and continuing the description, an insulating layer 21 is formed on the upper surface of the base plate 1 relative to the periphery of the first semiconductor construction 2 and on the upper surface of the first semiconductor construction 2 relative to the periphery of the second semiconductor construction 13 to make the upper surface of the insulating layer 21 and the upper surface of the second semiconductor construction 13 be substantially the same plane. The insulating layer 21 is generally referred to as a pre-impregnated material, for example, made of a material where thermosetting resin made of epoxy resin, polyimide resin or BT resin is impregnated with a base material made of glass fabric, glass fiber or aramid fiber.

An upper layer insulating film 22 is formed on the upper surfaces of the second semiconductor construction 2 and the insulating layer 21 having a flat upper surface. The upper layer insulating film 22 is generally referred to as a buildup material used for a buildup substrate, and for example, formed of a material where a reinforcing material consisting of glass fiber, aramid fiber, silica filler or ceramics filler is dispersed in a thermosetting resin made of epoxy resin, polyimide resin or BT resin.

Openings 23 are formed in portions of the upper layer insulating film 22 and the insulating layer 21 corresponding to the centers of the upper surfaces of the columnar electrodes 11 in the first semiconductor construction 2. Openings 24 are formed in portions of the upper layer insulating film 22 corresponding to the centers of the upper surface of the columnar electrodes 15 in the second semiconductor construction 13. An upper substrate metal layer 25 made of copper is arranged on the upper surface of the upper layer insulating film 22. Upper layer wires 26 made of copper are arranged on the entire upper surface of the upper layer substrate metal layer 25. One end of the upper layer wires 26 including the upper layer substrate metal layer 25 connects to the upper surfaces of the columnar electrodes 11 & 15 in the first & second semiconductor constructions 2 & 13 via the openings 23 & 24 in the upper layer insulating film 22 and the insulating layer 21 respectively.

An overcoat film 27 made of solder resist and the like is formed on the upper surface of the upper layer insulating film 22 including the upper layer wires 26. Openings 28 are formed in portions of the overcoat film 27 corresponding to the connection pads of the upper layer wires 26, respectively.

Solder balls 29 are arranged inside and over the openings 28 by connecting to the connection pads of the upper layer wires 26 respectively. The solder balls 29 are arranged as a matrix over substantially the entire region on the overcoat film 27.

As described above, in this semiconductor device, the first and second semiconductor constructions 2 and 13 are laminated and arranged on the base plate 1; the insulating layer 21 is formed on the base plate 1 relative to the peripheries of the first and second semiconductor constructions 2 and 13; the upper layer insulating wires 26 are arranged on the upper layer insulating film 22 formed on the insulating layer 21 by electrically connecting the first and second semiconductor constructions 2 and 13 (not translated) to the columnar electrodes 11 and 15 respectively; and the solder balls 29 are arranged on the connection pads of the upper layer wires 26. Therefore, the electrical connected wiring is mainly setup in a thickness direction relative to the base plate thereby enabling further reduction of an area for mounting, and making the device suitable for high frequency use because the wiring length can be the shortest.

Figure 3:
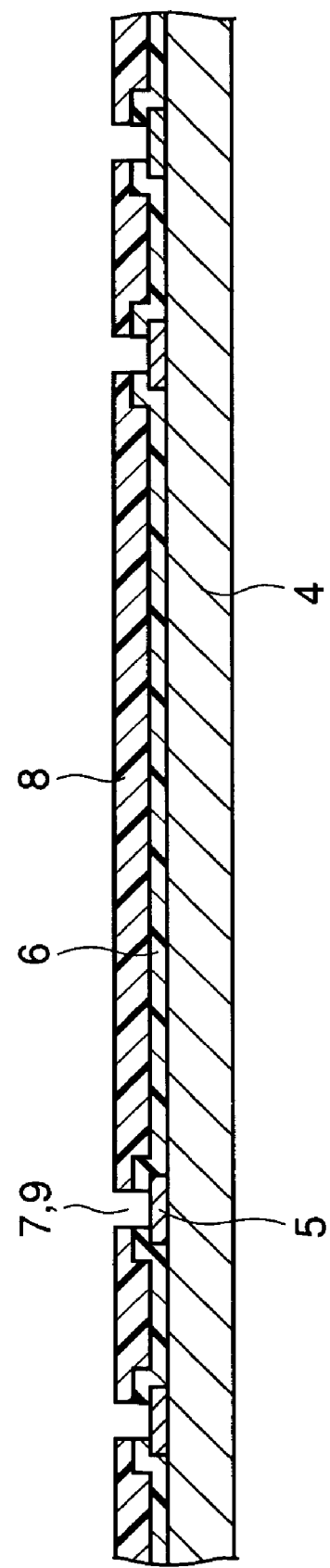
FIG. 3 is a cross-sectional view of prepared members at the beginning in an example of the manufacturing method of the semiconductor device shown in FIG. 1.

Next, in order to describe an example of the manufacturing method for this semiconductor device, first, an example of the manufacturing method for the first semiconductor construction 2 is described. In this case, first, as shown in FIG. 3, a unit having connection pads 5 consisting of aluminum-base metal, an insulating film 6 made of silicon oxide and a protective film 8 made of epoxy resin or polyimide resin are provided on the wafer silicon substrate (semiconductor substrate) 4, and the centers of the connection pads 5 are exposed via the openings 7 and 9 formed in the insulating film 6 and protective film 8 is prepared. In this case, integrated circuits (not shown) with pre-determined functions are formed in the region(s) on the upper surface of the wafer silicon substrate 4 where each of the first semiconductor construction 2 are provided and the connection pads 5 formed around the periphery of the regions electrically connect to the integrated circuit formed in the corresponding regions.

Figure 4:
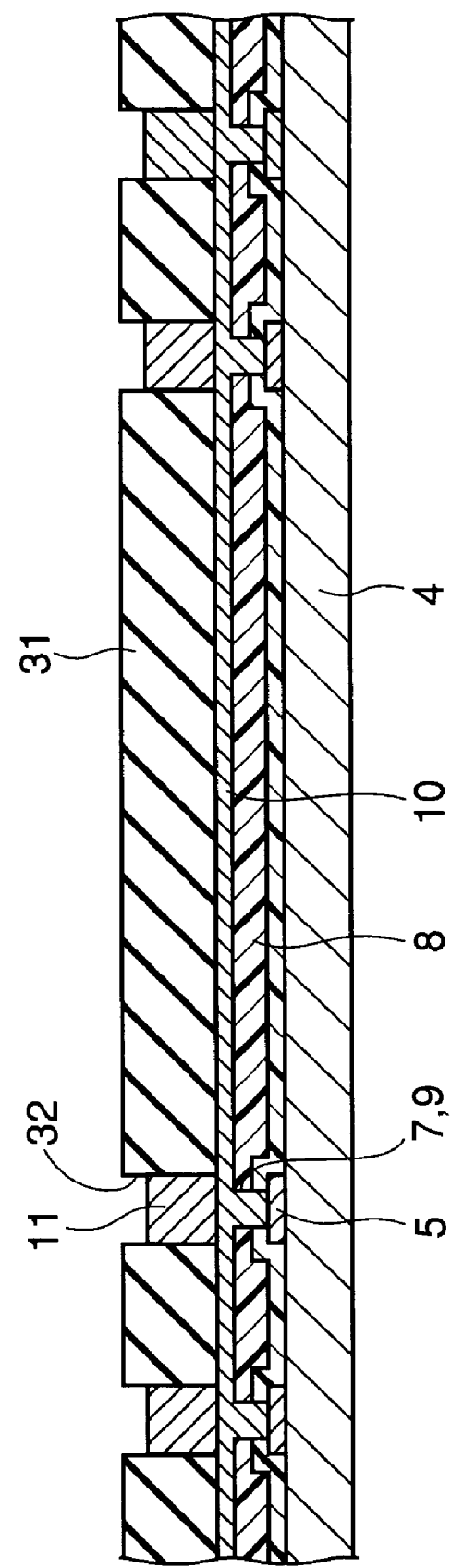
FIG. 4 is a cross-sectional view of the process following that of FIG. 3.

Next, as shown in FIG. 4, the substrate metal layer 10 is formed over the entire upper surface of the protective film 8 which includes the upper surfaces of the exposed connection pads 5 via both the openings 7 and 9. In this case, the substrate metal layer 10 can be only a copper layer formed by electroless plating, a copper layer formed by sputtering or a copper layer formed by sputtering on a thin film layer of titanium, etc. formed by sputtering.

Next, a plated-resist film 31 is formed to be patterned on the upper surface of the substrate metal layer 10. In this case, openings 32 are formed in portions of the plated-resist film 31 corresponding to the regions where the columnar electrodes 11 are formed. Next, the columnar electrodes 11 are formed on the upper surface of the substrate metal layer 10 inside the opening 32 in the plated-resist film 31 by performing copper electrolytic plating with making the substrate metal layer 10 into a plating current path.

Figure 5:
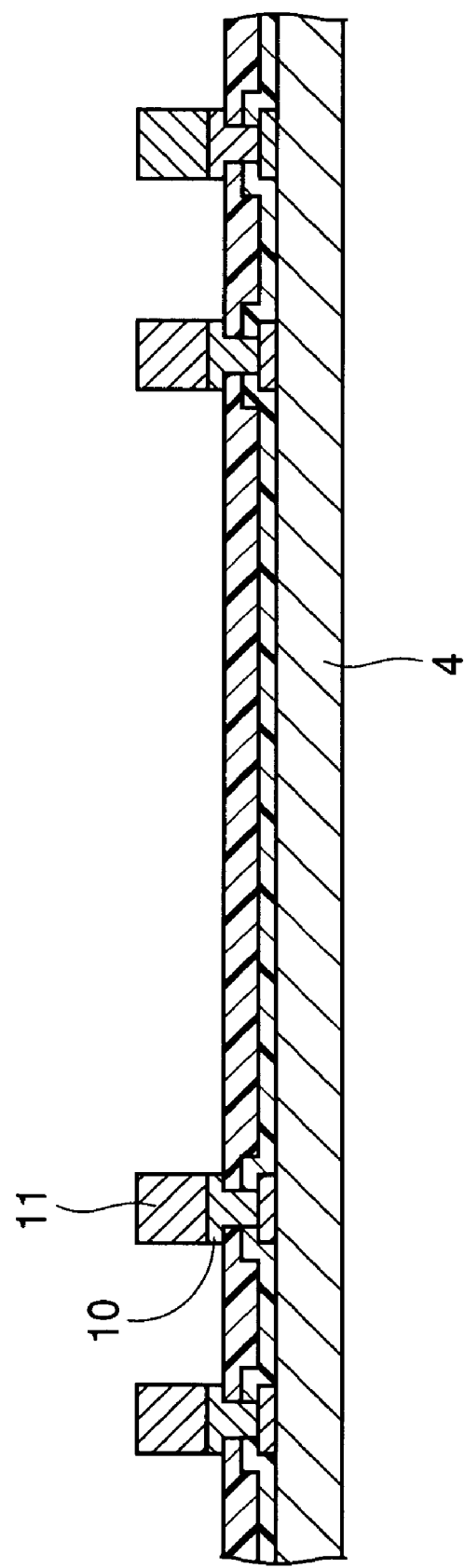
FIG. 5 is a cross-sectional view of the process following that of FIG. 4.

Next, the plated-resist film 31 is peeled off, and when the unnecessary portions in the substrate metal layer 10 are subsequently etched and removed by using the columnar electrodes 11 as a mask, as shown in FIG. 5, the substrate metal layer 10 remains only under the columnar electrodes 11.

Figure 6:
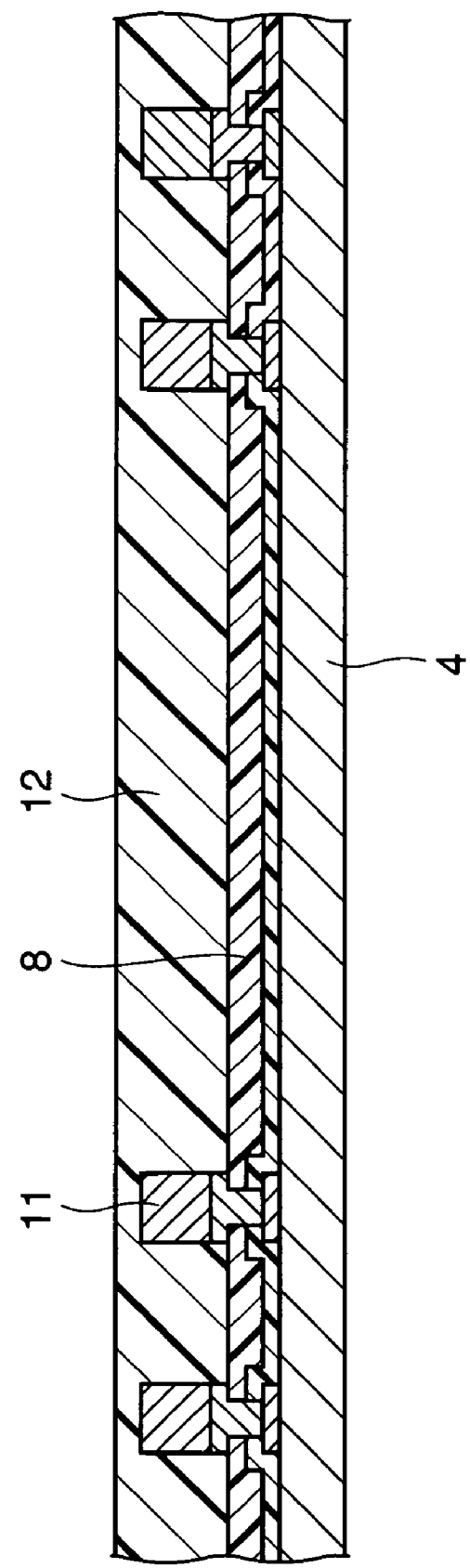
FIG. 6 is a cross-sectional view of the process following that of FIG. 5.

Next, as shown in FIG. 6, a sealing film 12 made of epoxy resin or polyimide resin and the like is formed over the whole upper surface of the protective film 8 including the columnar electrodes 11 using screen printing, a spin coat method or a die coat method, etc. so as to be thicker than the height of the columnar electrode 11. Therefore, in this state, the upper surfaces of the columnar electrodes 11 are covered with the sealing film 12.

Figure 7:
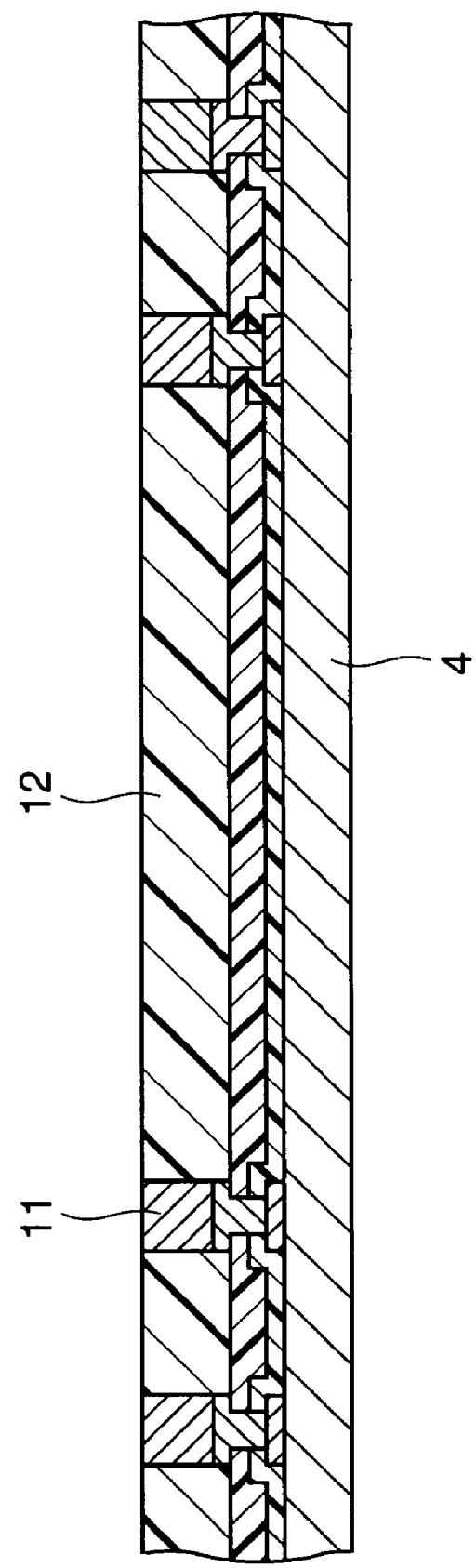
FIG. 7 is a cross-sectional view of the process following that of FIG. 6.

Next, the sealing film 12 and upper surface side of the columnar electrodes 11 are properly polished, and as shown in FIG. 7, the upper surfaces of the columnar electrodes 11 are exposed and the upper surface of the sealing film 12 including the exposed upper surfaces of the columnar electrodes 11 are leveled. Herein, the reason the upper surface side of the columnar electrodes 11 is properly polished is because the height of the columnar electrodes 11 formed by electrolytic plating varies. Therefore, this variation is eliminated and the height of the columnar electrodes 11 is made uniform.

Figure 8:
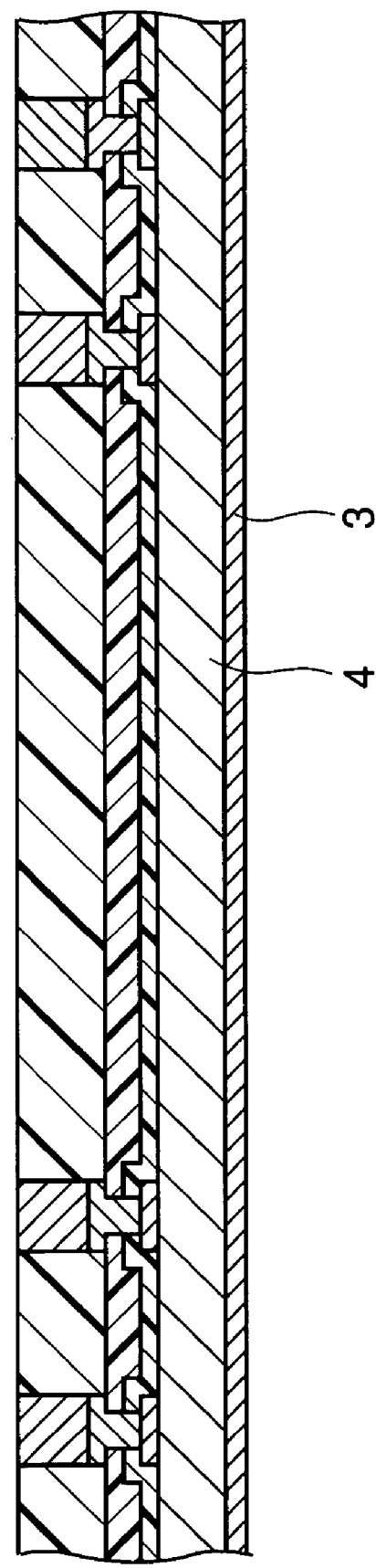
FIG. 8 is a cross-sectional view of the process following that of FIG. 7.

Next, as shown in FIG. 8, the adhesive layer 3 is adhered over the entire lower surface of the silicon substrate 4. The adhesive layer 3 is made of a die bond material, such as epoxy resin or polyimide resin, etc. which is marketed as die attachment film and adheres to the lower surface of the silicon substrate 4 in a semi-hardened state by heating pressurization.

Figure 9:
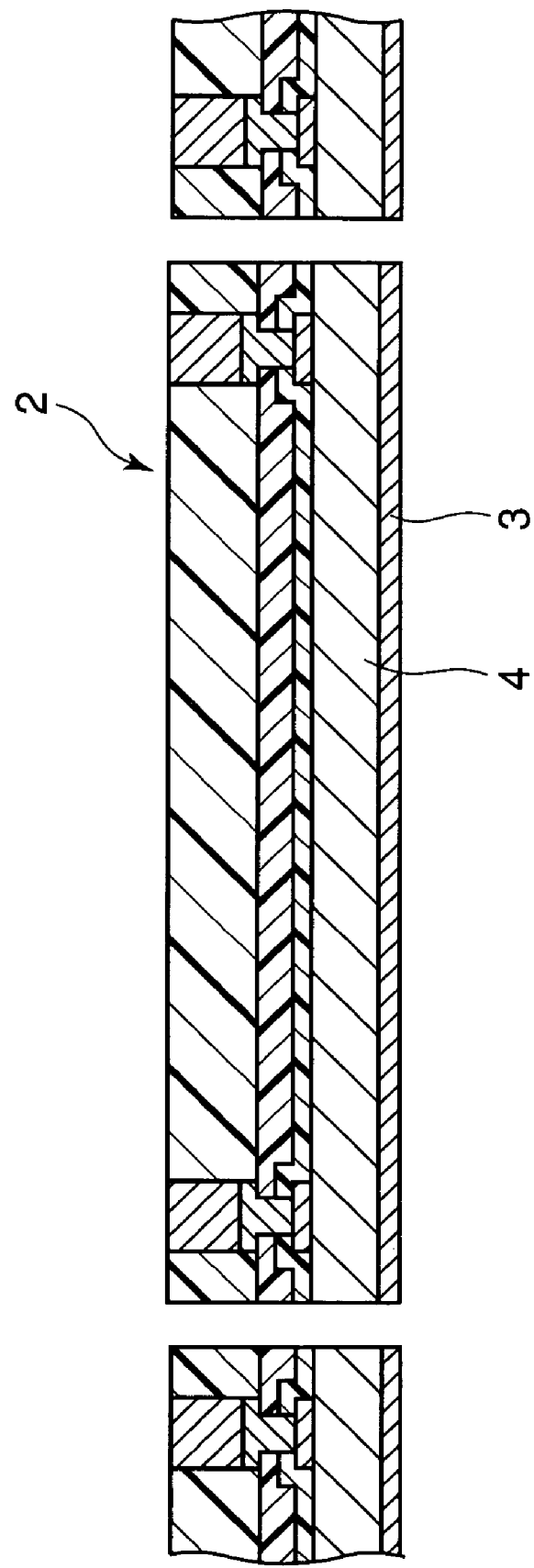
FIG. 9 is a cross-sectional view of the process following that of FIG. 8.

Next, the lower surface of the adhesive layer 3 adhered onto the lower surface of the silicon substrate 4 is attached to a dicing tape (not shown). After the dicing process shown in FIG. 9, the dicing tape is peeled off from the dicing tape, the first semiconductor constructions 2 having the adhesive layer 3 on the lower surface of the silicon substrate 4 will be obtained. Further, using a similar manufacturing method, the second semiconductor constructions 13 having the adhesive layer 14 shown in FIG. 1 are obtained.

Figure 10:
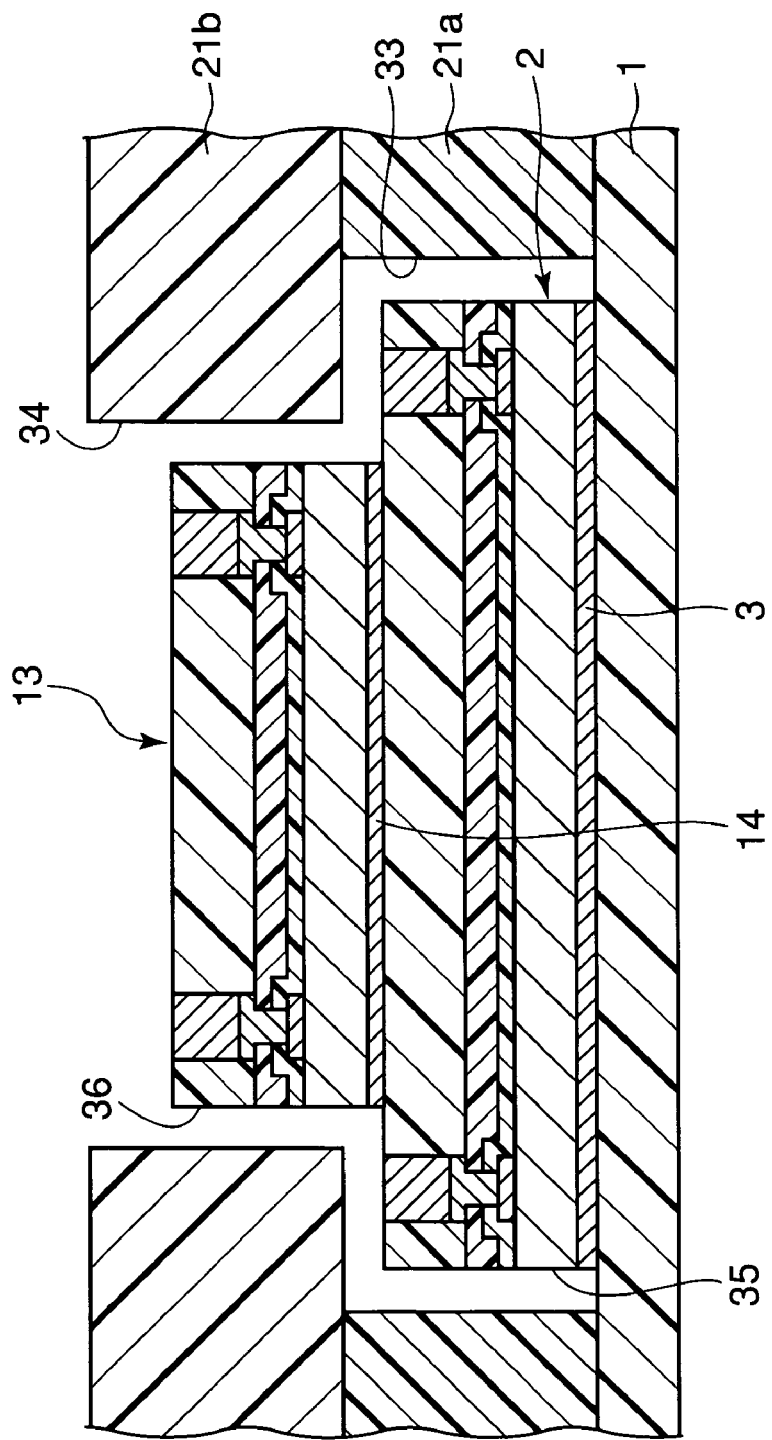
FIG. 10 is a cross-sectional view of the process following that of FIG. 9.

Next, an example of manufacturing the semiconductor device shown in FIG. 1 is described using the first and second semiconductor constructions 2 and 13 obtained as described above. First, as shown in FIG. 10, the base plate 1 having a sufficient area to enable the construction of the semiconductor devices shown in FIG. 1 is prepared. In this case, the shape of the base plate 1 is limited to a specific one, but can for example, be a square plane or rectangular plane. Next, the adhesive layer 3 of the semiconductor constructions 2 is adhered onto the upper surface of the base plate 1 by mutual separation on pre-determined regions. Next, adhesive layer 14 of each second semiconductor constructions 13 is adhered onto the centers of the upper surfaces of each of the first semiconductor constructions 2 respectively. In this instance, adhesion is carried out by actual hardening of the adhesive layers 3 and 14 by heating pressurization. The adhesion process can be designed such that after the first semiconductor constructions 2 are adhered onto the upper surface of the base plate 1, the second semiconductor constructions 13 are adhered onto the upper surface of the first semiconductor constructions 2 respectively or it can be designed such that after the first semiconductor constructions 2 are temporarily adhered onto the base plate 1 at a semi-hardening temperature and the second semiconductor constructions 13 are temporarily adhered onto the upper surface of the first semiconductor constructions 2 at a semi-hardening temperature, the base plate 1, the first semiconductor constructions 2 and the second semiconductor constructions 13 are actual hardened.

Next, while first and second lattice-like insulating layer construction sheets 21a and 21b are positioned on the upper surface of the base plate 1 relative to the periphery of the first semiconductor construction 2 using pins, etc., they are laminated and arranged. By impregnating thermo-setting resin made of epoxy resin, etc. with base materials made of glass fabric, etc., subsequently forming rectangular openings 33 and 34 by use of punching, drilling or router machining, etc. into pre-impregnated materials where thermosetting resin is semi-hardened (B stage) and made as a sheet, the first and second lattice-like insulating layer construction sheets 21a and 21b can be obtained.

Herein, the size of the opening 33 in the first insulating layer construction sheet 21a is slightly larger than that of the first semiconductor construction 2 and the size of the opening 34 in the second insulating layer construction sheet 21b is smaller than that of the opening 33 in the first insulating layer construction sheet 21a but slightly larger than that of the second semiconductor construction 13. Consequently, clearances 35 and 36 are created between the first insulating layer construction sheet 21a and the first semiconductor construction 2 and between the second insulating layer construction sheet 21b and the second semiconductor construction 13 respectively.

Further, the thicknesses of the first and second insulating layer construction sheets 21a and 21b are the same but thicker than those of the first and second semiconductor constructions 2 and 13 to some extent respectively, and as described below, when heat and pressure are applied, the thickness is that the clearances 35 and 36 can be sufficiently buried with the thermosetting resin in the first and second insulating layer construction sheets 21a and 21b, respectively. Furthermore, the first and second insulating layer construction sheets 21a and 21b may have different thicknesses.

Figure 11:
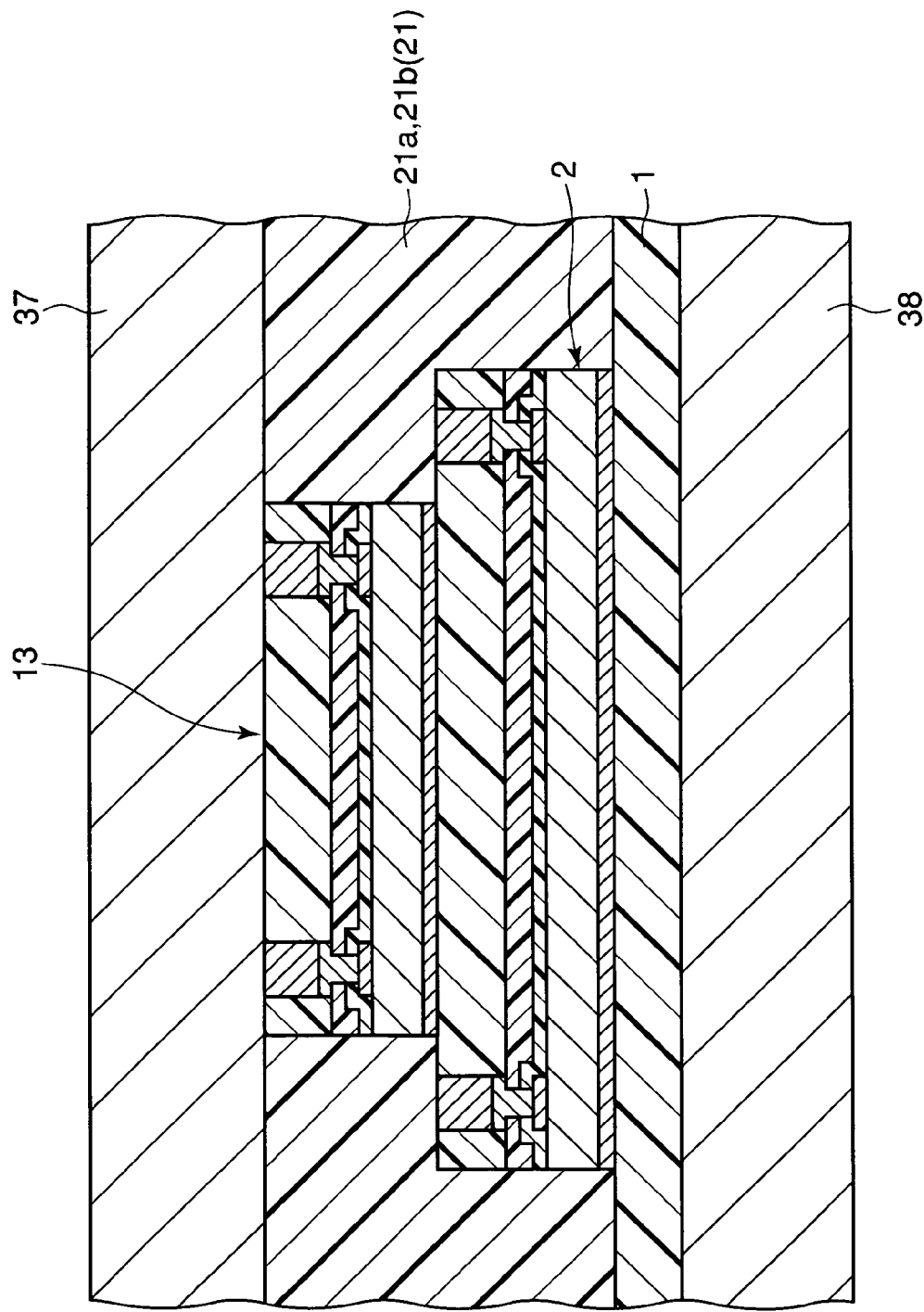
FIG. 11 is a cross-sectional view of the process following that of FIG. 10.

Next, as shown in FIG. 11, heat and pressure are applied to the first and second insulating layer construction sheets 21a and 21b from the top and bottom sides using a pair of hot pressing plates 37 and 38. Then, the fused thermosetting resin in the first and second insulating layer construction sheets 21a and 21b are pushed out and fill the inside of the clearances 35 and 36, respectively, and a cooling process results in the construction of an insulating layer 21 on the upper surface of the base plate 1 relative to the periphery of the first semiconductor construction 2 and the upper surface of the first semiconductor construction 2 relative to the periphery of the second semiconductor construction 13.

Figure 12:
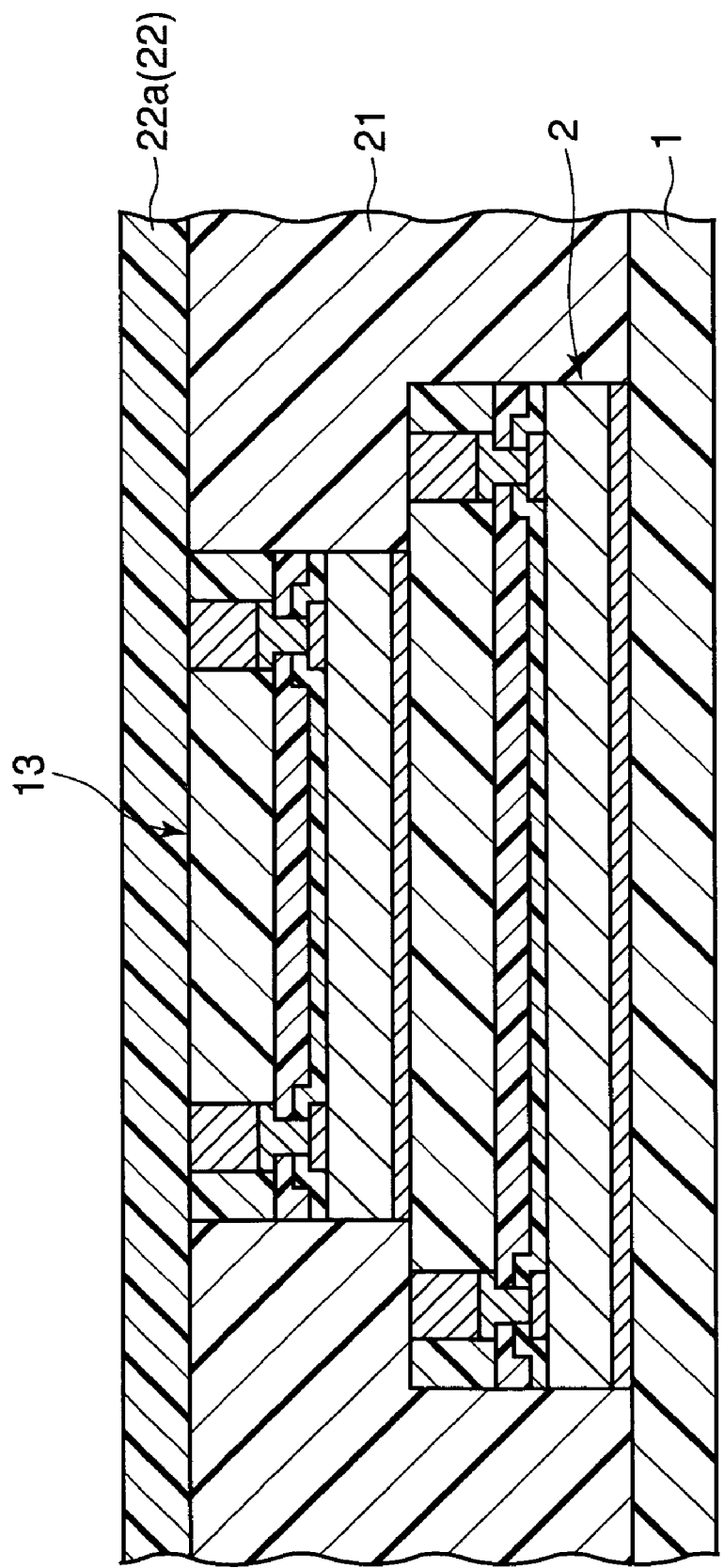
FIG. 12 is a cross-sectional view of the process following that of FIG. 11.

Next, as shown in FIG. 12, an upper layer insulating film construction sheet 22a is arranged on the upper surfaces of the second semiconductor construction 13 and the insulating layer 21. This does not mean to limit the material for the upper insulating film construction sheet 22a but a sheet-state buildup material is preferable, and as the buildup material, silica filler is mixed into thermosetting resin, such as epoxy resin, etc. and the thermosetting resin is semi-hardened.

Next, when heat and pressure are applied from the top and bottom sides using a pair of un-shown hot pressing plates, the upper insulating film 22 is formed on the upper surfaces of the second semiconductor construction 13 and the insulating layer 21. In this case, because the upper surface of the upper insulating film 22 is pressed by the lower surface of the upper side hot pressing plate, it becomes a flat surface.

Furthermore, as the upper layer insulating film construction sheet 22a, a pre-impregnated material formed in the shape of sheet in which thermosetting resin made of epoxy resin, etc. is impregnated with a base material made of glass fabric, subsequently the thermosetting resin is semi-hardened and made as a sheet or a sheet material made only from semi-hardened thermosetting resin in which no silica filler is mixed can be used.

Figure 13:
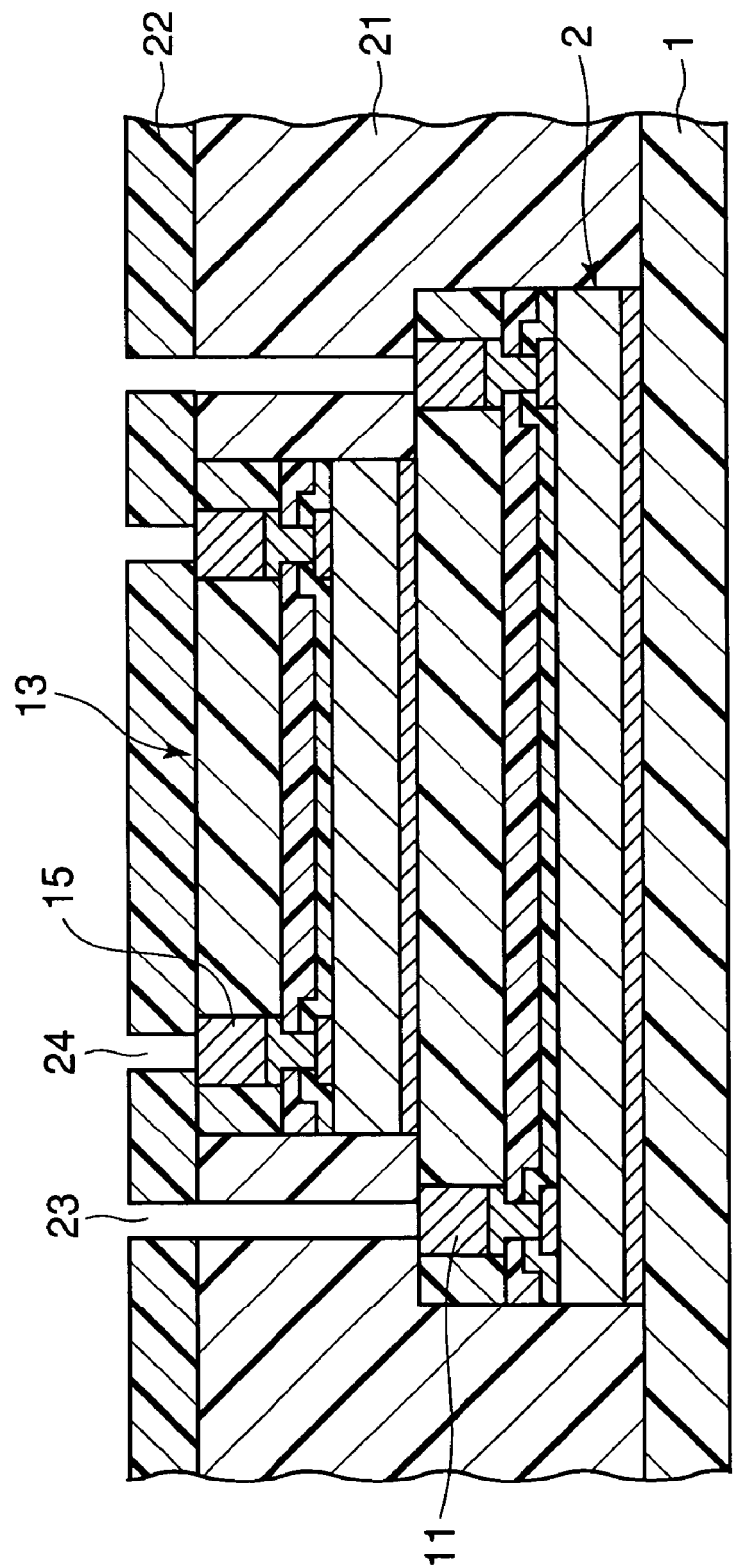
FIG. 13 is a cross-sectional view of the process following that of FIG. 12.

Next, as shown in FIG. 13, openings 23 are formed in the upper layer insulating film 22 and the insulating layer 21 corresponding to portions of the columnar electrodes 11 in the first semiconductor construction 2 by laser processing to irradiate a laser beam such as a CO2 laser. At the same time, openings 24 are formed in the upper layer insulating film 22 corresponding to portions of the columnar electrodes 15 in the second semiconductor construction 13. Next, epoxy smear, etc. generated inside the openings 23 and 24 is eliminated by de-smear processing as the occasion demands.

Figure 14:
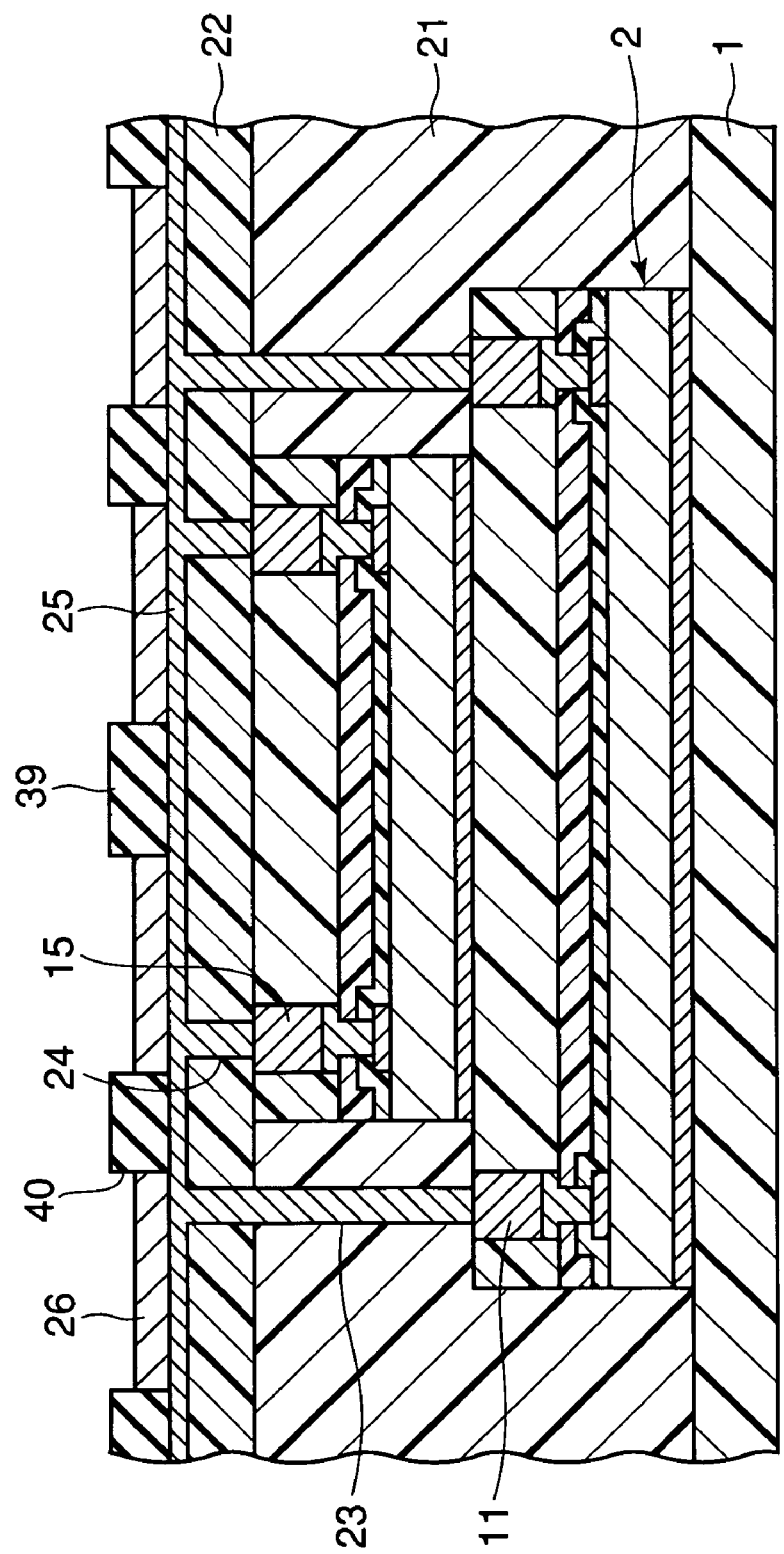
FIG. 14 is a cross-sectional view of the process following that of FIG. 13.

Next, as shown in FIG. 14, an upper layer substrate metal layer 25 is formed over the upper surface of the upper layer insulating film 22 including the exposed upper surfaces of the columnar electrodes 11 and 15 via the openings 23 and 24 using copper electroless plating, etc. Next, a plated-resist film 39 is pattern formed on the upper surface of the upper layer substrate metal layer 25. In this case, openings 40 are formed in portions corresponding to the construction regions of the upper layer wires 26 in the plated-resist film 39.

Figure 15:
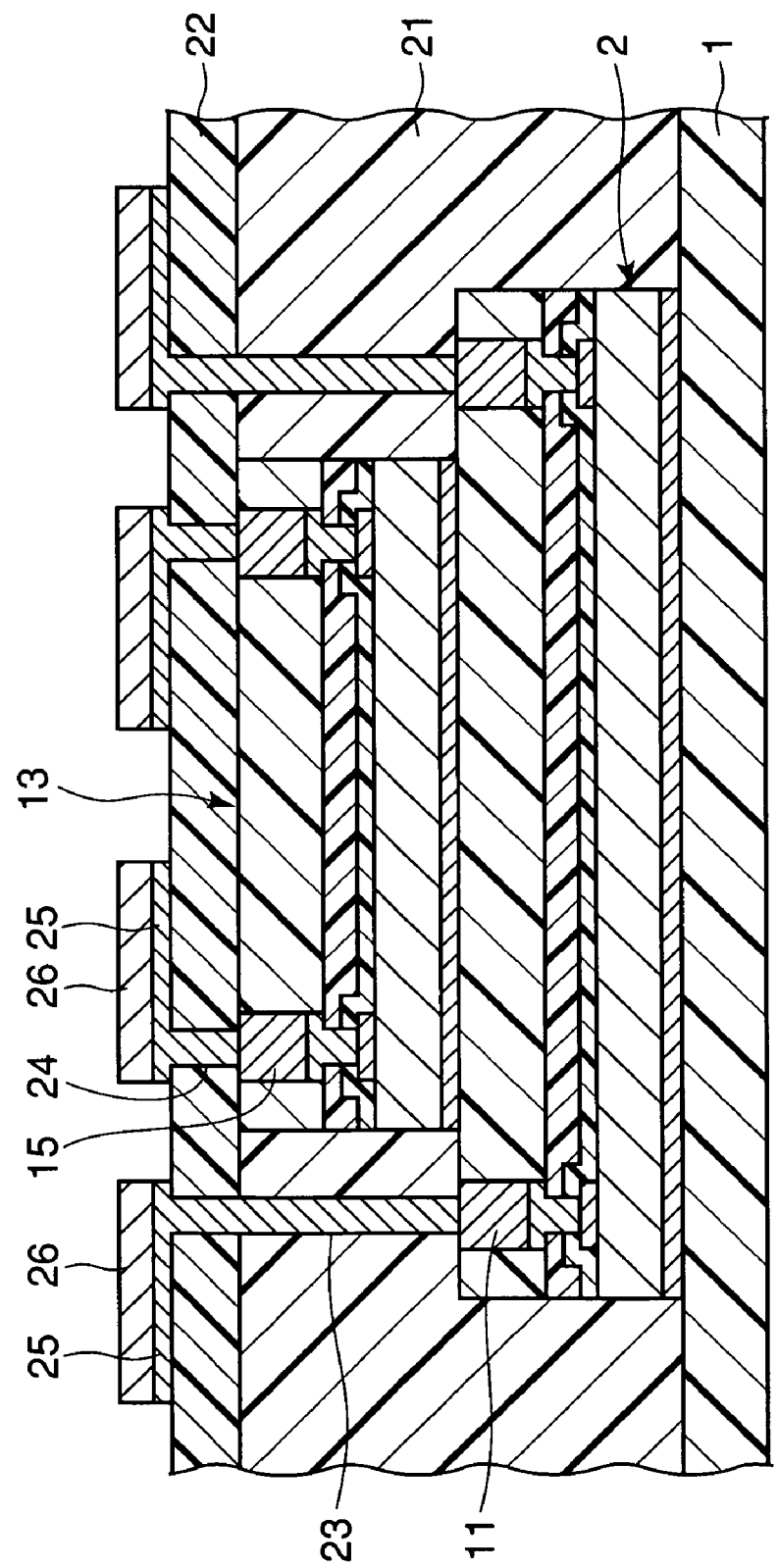
FIG. 15 is a cross-sectional view of the process following that of FIG. 14.

Next, by performing copper electrolytic plating using the upper layer substrate metal layer 25 as the plating current path, the upper layer wires 26 is formed on the upper surface of the upper layer substrate metal layer 25 inside the openings 40 in the plated-resist film 39. Next, when the plated-resist film 39 is peeled off and unnecessary portions of the upper layer substrate metal layer 25 are etched and removed using the upper layer wires 26 as a mask, the upper layer substrate metal layer 25 remains only under the upper layer wires 26 as shown in FIG. 15. In this state, ends of the upper layer wires 26 including the upper layer substrate metal layer 25 connect to the upper surfaces of the columnar electrode 11 or 15 via the opening 23 or 24 respectively.

Figure 16:
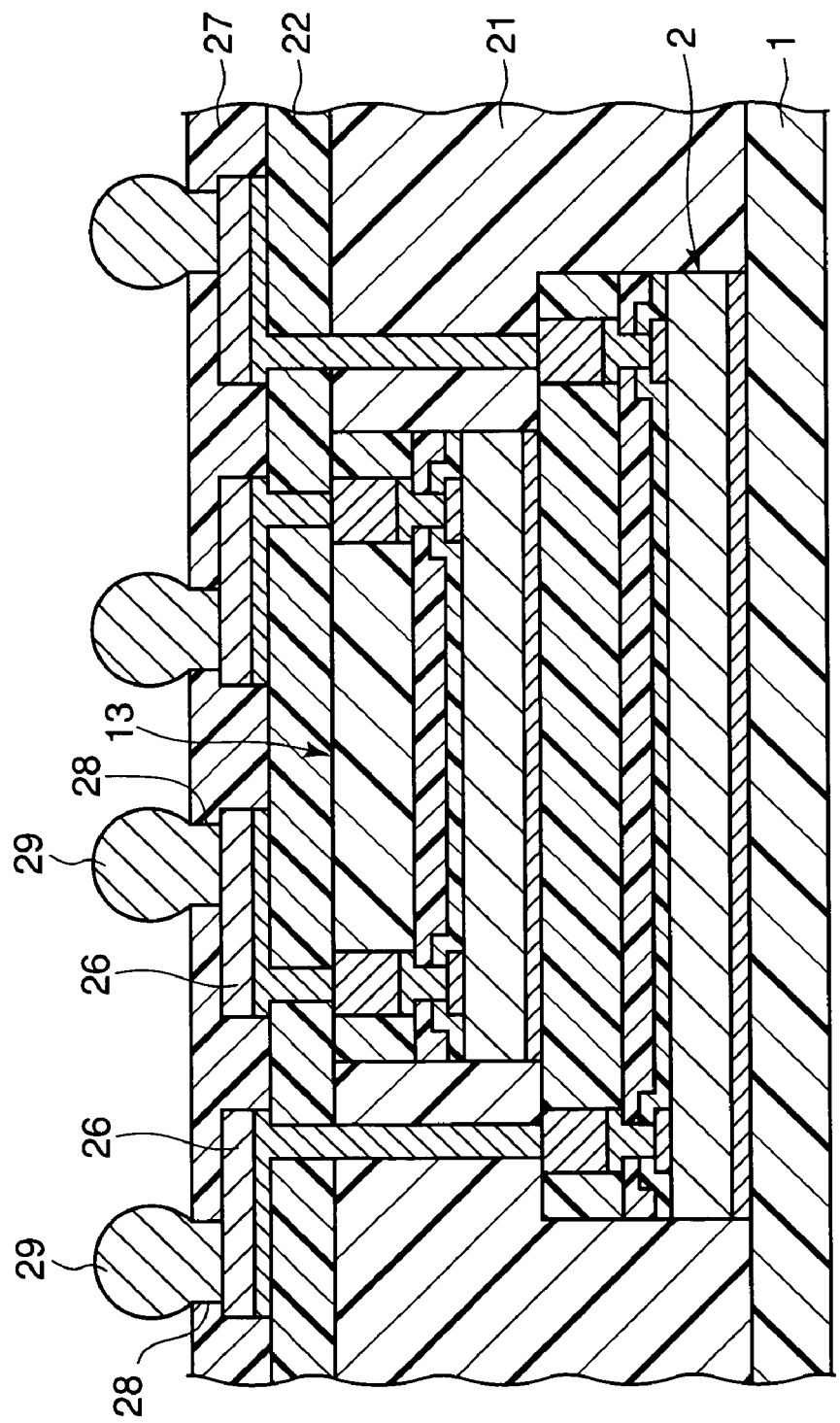
FIG. 16 is a cross-sectional view of the process following that of FIG. 15.

Next, as shown in FIG. 16, the overcoat film 27 made of solder resist, etc. is formed over the upper surface of the upper layer insulating film 22 including the upper layer wires 26 using a screen printing method, a spin coat method or a die coat method. In this case, the openings 28 are formed in portions corresponding to the connection pads of the upper layer wires 26 in the overcoat film 27 respectively.

Next, solder balls 29 are formed inside and over the openings 28 by connecting to the connection pads of the upper layer wires 26 respectively. When the overcoat film 27, the upper layer insulating film 22, the insulating layer 21 and the base plate 1 are cut off in between the adjacent first semiconductor construction 2, the semiconductor devices shown in FIG. 1 are obtained.

By the way, in the manufacturing method, pairs of the first and second semiconductor constructions 2 and 13 are laminated and arranged on the base plate 1, and then the openings 23 & 24, the upper layer wires 26 and the solder balls 29 are collectively formed to the pairs of the first and second semiconductor constructions 2 and 13. Since they are divided after that and semiconductor devices are obtained, a manufacturing process can be simplified. Further, in the manufacturing process shown in FIG. 11 and subsequent processes, since the pairs of the first and second semiconductor constructions 2 and 13 can be conveyed along with the base plate 1, the manufacturing process can be simplified also by this way.

B. Second Embodiment

Figure 17:
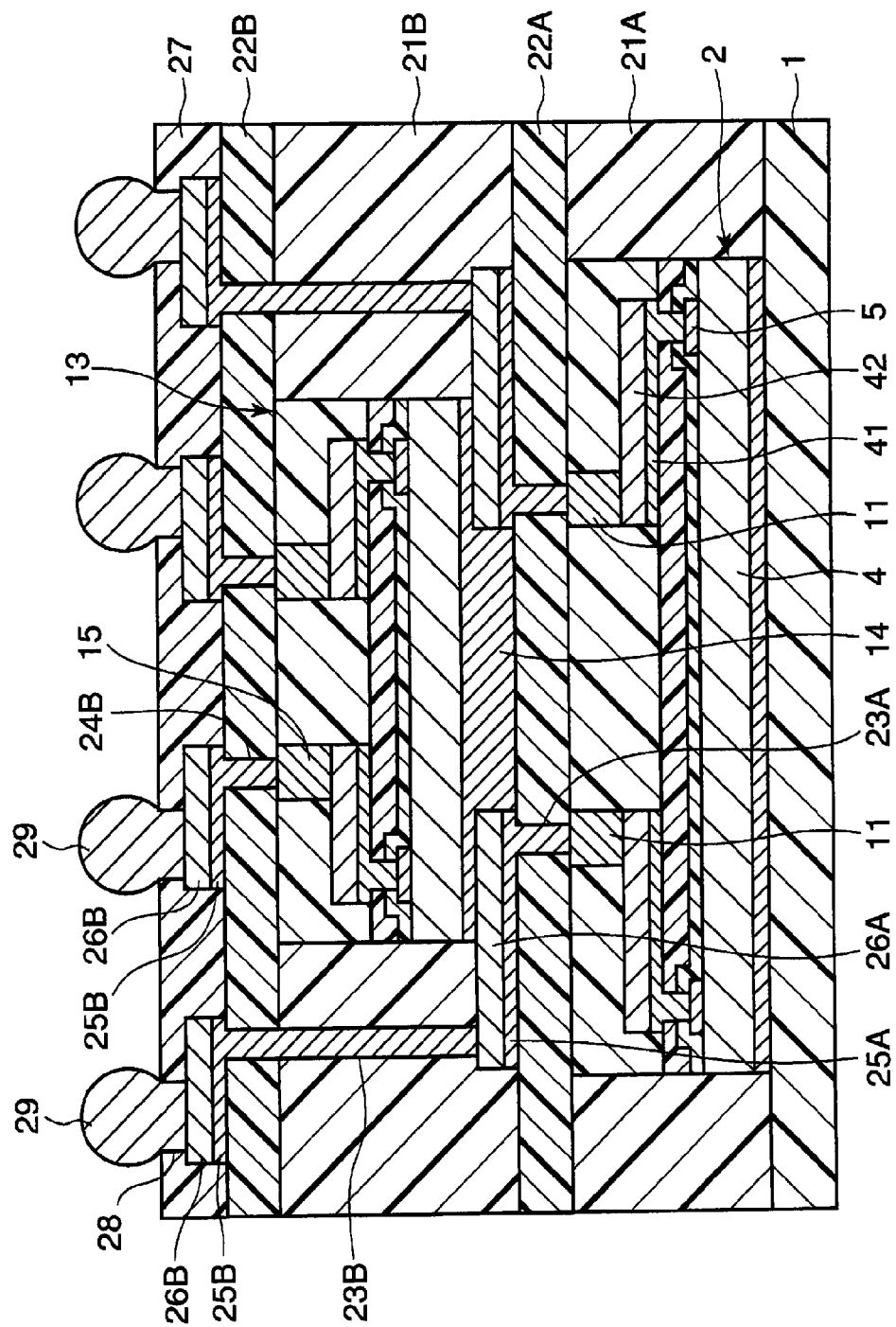
FIG. 17 is a cross-sectional view of a semiconductor device of a second embodiment of the present invention.

FIG. 17 shows a cross-sectional view of a semiconductor device of the second embodiment according the present invention. This semiconductor device greatly differs from the semiconductor device shown in FIG. 1. There are two greatly different points. First point is that insulating layers (21A and 21B), upper layer films (22A and 22B) and upper layer wires (26A and 26B) are formed in the composition of two layers, respectively. Second point is that the first semiconductor construction 2 is constructed with wires 42 (in a structure also similarly applied to the second semiconductor construction 13).

In other words, the first semiconductor constructions 2 are formed in pre-determined regions on the upper surface of the base plate 1 via the adhesive layer 3. The first insulating layer 21A is formed on the upper surface of the base plate 1 relative to the periphery of the first semiconductor formation 2 to make the upper surfaces of the first insulating layer 21A and the first semiconductor construction 2 to be substantially the same plane. The first upper layer insulating film (interlayer insulating film) 22A is formed with a flat upper surface on the upper surfaces of the first semiconductor construction 2 and the first insulating layer 21A.

The first upper layer wires (relay wires) 26A including the first upper layer substrate metal layer 25A are arranged on the upper surface of the first upper layer insulating film 22A. One end of the upper layer wires 26A including the first upper layer substrate metal layer 25A is connected to the upper surfaces of the columnar electrodes 11 in the first semiconductor construction 2 via the openings 23A of the first upper layer insulating film 22A respectively. In this case, the connection pads of the first upper layer wires 26A are positioned at outside of the arranged region of the second semiconductor construction 13.

The second semiconductor construction 13 is arranged on the upper surface of the first upper layer insulating film 22A including the first upper layer wires 26A relative to the center of the upper surface of the first semiconductor construction 2 via the adhesive layer 14. The second insulating layer 21B is formed on the upper surface of the first upper layer insulating film 22A including the first upper layer wiring 26A relative to the periphery of the second semiconductor construction 13 to make the upper surfaces of the second insulating layer 21B and the second semiconductor construction 13 to be substantially the same plane. The second upper layer insulating film 22B is formed on the upper surfaces of the second semiconductor construction 13 and the second insulating layer 21B to make the upper surfaces of the second upper layer insulating film 22B to be flat plane.

The second upper layer wiring 26B including the second upper layer substrate metal layer 25B is arranged on the upper surface of the second upper layer insulating film 22B. One end of some of second upper layer wiring 26B including the second upper layer substrate metal layer 25B connect to the upper surfaces of the connection pads of the first upper layer wiring 26A via the openings 23B in the second upper layer insulating film 22B and the second insulating layer 21B respectively.

One end of the remaining second upper layer wiring 26B including the second upper layer substrate metal layer 25B connects to the upper surfaces of the columnar electrodes 15 in the second semiconductor construction 13 via the opening 24B in the second upper layer insulating film 22B respectively. The solder balls 29 connect to the upper surfaces of the connection pads of the second upper layer wiring 26B via the openings 28 in the overcoat film 27.

In making the first semiconductor construction 2 to be representative for the first and second semiconductor constructions 2 and 13, it is generally referred to as CSP (chip size package) and it has a structure where the wires 42 including a substrate metal layer 41 are arranged on the upper surface of the protective film 8 by connecting to the connection pads 5; the columnar electrodes 11 are arranged on the upper surfaces of the connection pads of the wires 42; and the sealing film 12 is formed over the upper surface of the protective film 8 including the wires 42 to make the upper surfaces of the sealing film 12 to be the same plane of the upper surface of the columnar electrodes 11.

In this case, since the first upper layer wires 26A are especially arranged on the upper surface of the first upper layer insulating film 22a formed on the first semiconductor construction 2 and the first insulating layer 21A, and the second semiconductor construction 13 is provided on the first upper layer wires 26A, it becomes possible to have a structure of the first semiconductor construction 2 where the columnar electrodes 11 are arranged over substantially the entire region on the silicon substrate 4 to be the shape of a matrix. Furthermore, since the connection pads of the first upper layer wires 26A can be arranged outside the arrangement region for the second semiconductor construction 13, the size of the second semiconductor construction 13 can be the same as that of the first semiconductor construction 2.

Next, an example of the manufacturing method for this semiconductor device is briefly described hereafter.

First, the base plate 1 having an area to enable the construction of finished semiconductor devices shown in FIG. 17 is prepared. However, even this does not limit the base plate 1, for example, the shape of the base plate 1 may be a square plane or rectangular plane.

Next, the first semiconductor constructions 2 are arranged on the upper surface of the base plate 1 via the adhesive layer 3. Next, the first lattice-like insulating layer construction sheet is arranged positioned to the upper surface of the base plate 1 relative to the periphery of the first semiconductor constructions 2 using pins. Next, heat and pressure are applied from top and bottom sides to the first semiconductor constructions 2 using a pair of hot pressing plates, and the first insulating layer 21A is formed on the upper surface of the base plate 1 relative to the periphery of the first semiconductor constructions 2.

Next, the first upper layer insulating film construction sheet is arranged on the upper surfaces of the first semiconductor constructions 2 and the first insulating layers 21A. Heat and pressure are applied from the top and bottom sides to the first semiconductor constructions 2 and the first insulating layers 21A using a pair of the hot pressing plates, and the first upper layer insulating film 22A is formed on the upper surfaces of the first semiconductor construction 2 and the first insulating layer 21A. Next, the openings 23A are formed in the first upper layer insulating film 22A in portions corresponding to the columnar electrodes 11 of the first semiconductor construction 2.

Next, the first upper layer wires 26A including the first upper layer substrate metal layer 25A are formed on the upper surface of the first upper insulating film 22A via the opening 23A by connecting to the upper surface of the columnar electrode 11 in the first semiconductor construction 2. Next, the second semiconductor construction 13 is arranged on the upper surface of the first upper layer insulating film 22A including the first upper layer wires 26A via the adhesive layer 14.

Next, the second lattice-like insulating layer construction sheet is positioned to be arranged on the upper surface of the first upper layer insulating film 22A including the first upper layer wires 26A relative to the periphery of the second semiconductor construction 13 using pins. Next, heat and pressure are applied from top and bottom sides to the second semiconductor construction 13 using a pair of hot pressing plates, and the second insulating layer 21B is formed on the upper surface of the first upper layer insulating film 22A including the first upper layer wires 26A relative to the periphery of the second semiconductor construction 13.

Next, the second upper layer insulating film construction sheet is arranged on the upper surfaces of the second semiconductor construction 13 and the second insulating layer 21B. Heat and pressure are applied from top and bottom sides to the second semiconductor construction 13 and the second insulating layer 21B using a pair of hot pressing plates, and the second upper layer insulating film 22B is formed on the upper surfaces of the second semiconductor construction 13 and the second insulating film 21B. Next, by laser processing to irradiate a laser beam such as a CO2 laser, etc., the openings 23B are formed in portions of the second upper layer insulating film 22B and the second insulating layer 21B corresponding to the first upper layer wires 26A, at the same time, the openings 23B are formed in portions of the second upper layer insulating film 22B corresponding to the columnar electrodes 15 in the second semiconductor construction 13.

Next, the second upper layer wiring 26B including the second upper layer substrate metal layer 25B is formed on the upper surface of the second upper layer insulating film 22B via the openings 23B or 24B by connecting to the upper surfaces of the connection pads of the first upper layer wires 26A or the upper surfaces of the columnar electrode 15 of the second semiconductor construction 13 respectively. Next, the overcoat film 27 is formed over the upper surface of the second upper layer insulating film 22B including the second upper layer wiring 26B. In this case, the openings 28 are formed in portions in the overcoat film 27 corresponding to the connection pads of the second upper layer wiring 26B.

Next, the solder balls 29 are formed inside and over the openings 28 by connecting to the connection pads of the upper layer wiring 26. Next, when the overcoat film 27, the second upper layer insulating film 22B, the second insulating layer 21B, the first upper layer insulating film 22A, the first insulating layer 21A and the base plate 1 are cut off in between the adjacent first semiconductor constructions 2, the semiconductor devices shown in FIG. 17 are obtained.

By the way, in the manufacturing method, the first semiconductor constructions 2 are arranged on the base plate 1; the openings 23A and the first upper layer wires 26A are collectively formed on the first semiconductor constructions 2; additionally the second semiconductor constructions 13 are arranged on the first upper layer insulating film 22A; and the openings 23B & 24B, the second upper layer wiring 26B and the solder balls 29 are collectively formed on the second semiconductor constructions 13. Since they are divided after that and semiconductor devices are obtained, the manufacturing process can be simplified.

C. Other Embodiment

For example, in the first embodiment, a case where the first and second lattice-like insulating layer construction sheets 21a and 21b made of a pre-impregnated material are laminated onto the upper surface of the base plate 1 relative to the periphery of the first semiconductor construction 2 and are arranged as shown in FIG. 10; next, heat and pressure are applied from the top and bottom sides to them using a pair of hot pressing plates 37 and 38; and the insulating layer 21 is formed on the upper surface of the base plate 1 relative to the periphery of the first semiconductor construction 2 and the upper surface of the first semiconductor construction 2 relative to the periphery of the second semiconductor construction 2 is described. However, the present invention is not limited to this case.

Apart from the above-mentioned case, it can be perform by the following methods.

For example, after the first and second semiconductor constructions 2 and 13 are laminated and arranged onto the upper surface of the base plate 1, thermosetting resin made of liquid epoxy resin containing a reinforcing material, such as fiber or filler, etc., or thermosetting resin made of liquid epoxy resin, etc. not containing a reinforcing material, is arranged on the upper surface of the base plate 1 relative to the periphery of the first semiconductor construction 2 and the upper surface of the first semiconductor construction 2 relative to the periphery of the second semiconductor construction 13 using a screen printing method, etc., next heat and pressure are applied from top and bottom sides to them using a pair of hot pressing plates, and the insulating layer 21 is formed on the upper surface of the base plate 1 relative to the periphery of the first semiconductor construction 2 and the upper surface of the first semiconductor construction 2 relative to the second semiconductor construction 13.

Each of the embodiments described a case where one second semiconductor construction 13 is arranged on the first semiconductor construction 2. However, the present invention is not limited to this construction. For example, two or more second semiconductor constructions can be arranged on the first semiconductor construction. Further, three or more semiconductor constructions can be laminated and arranged on the base plate.

In the case shown in FIG. 1, as the second semiconductor construction 13, the second semiconductor construction 13 provided with wiring 42 including the substrate metal layer 41 shown in FIG. 17 can be used. Further, in the case shown in FIG. 17, as the second semiconductor construction 13, the second semiconductor construction 13 shown in FIG. 1 can be used.

In addition, as the base plate, a metal plate consisting of copper or aluminum, etc. can be used and another type of base plate can be also used described below.

Above-mentioned another type of base plate has the structure in which a ground layer or a shield layer formed from a metal layer, such as copper foil, etc. is arranged at least in the arrangement regions of the first semiconductor constructions 2 on the upper surface of the insulating plate which is made of a glass fabric base material or epoxy resin, etc.

While the present invention has been described with reference to the preferred embodiments, it is our intention that the invention be not limited by any of the details of description thereof.

As this invention may be embodied in several forms without departing from the spirit of the essential characteristics thereof, the present embodiments are therefore illustrative and not restrictive, since the scope of the invention is defined by the appended claims rather than by the description preceding them, and all changes that fall within meets and bounds of the claims, or equivalence of such meets and bounds thereof are intended to be embraced by the claims.

What is claimed is:

1. A semiconductor device, comprising:
   a base plate;
   a first semiconductor construction which is arranged on the base plate and which has a first surface that includes a plurality of external connection electrodes formed around an upper surface periphery;
   a second semiconductor construction which is of a smaller size than the first semiconductor construction, and which is provided in an inner area of an external connection electrodes arrangement area of the first semiconductor construction, on the first surface of the first semiconductor construction;
   an insulating layer formed around a periphery of the first semiconductor construction and the second semiconductor construction;
   an upper layer insulating film formed on the first semiconductor construction, the second semiconductor construction and the insulating layer; and
   an upper layer wiring which is: (i) provided at least on the upper layer insulating film, (ii) electrically connected to the external connection electrodes of the first semiconductor construction, (iii) electrically connected to plural external connection electrodes of the second semiconductor construction, and (iv) extends to at least an area corresponding to the insulating layer formed around the periphery of the first semiconductor construction.

2. The semiconductor device according to claim 1, wherein a first part of the upper layer wiring is connected to the external connection electrodes of the first semiconductor construction via openings formed in the upper layer insulating film and the insulating layer; and wherein a second part of the upper layer wiring is connected to the external connection electrodes of the second semiconductor construction via openings formed in the upper layer insulating film.

3. A semiconductor device, comprising:

a base plate;

a first semiconductor construction which is arranged on the base plate and which has a plurality of external connection electrodes formed around an upper surface periphery;

a second semiconductor construction which is of a smaller size than the first semiconductor construction and which is provided in an inner area of an arrangement area of the external connection electrodes above the first semiconductor construction;

an insulating layer formed around a periphery of the first semiconductor construction and the second semiconductor construction;

an upper layer insulating film formed on the first semiconductor construction, the second semiconductor construction and the insulating layer; and an upper layer wiring which is: (i) provided at least on the upper layer insulating film, (ii) electrically connected to the external connection electrodes of the first semiconductor construction, (iii) electrically connected to plural external connection electrodes of the second semiconductor construction, and (iv) extends to at least an area corresponding to the insulating layer formed around the periphery of the first semiconductor construction;

wherein at least one of the first and second semiconductor constructions has columnar electrodes as the external connection electrodes and a sealing film positioned between the columnar electrodes.

4. The semiconductor device according to claim 3, wherein said one of the first and second semiconductor constructions having the columnar electrodes and the sealing film further comprises: (i) connection pads formed on a first surface of a semiconductor substrate, and (ii) a protective film which is formed on the first surface of the semiconductor substrate, which has openings that expose the connection pads and which has wirings formed thereon that connect the connection pads with the columnar electrodes.

5. The semiconductor device according to claim 1, wherein the first and second semiconductor constructions are laminated with an interlayer insulating film interposed therebetween.

6. The semiconductor device according to claim 5, wherein the upper layer wiring connected to the external connection electrodes is also formed on the interlayer insulating film.

7. A semiconductor device, comprising:

a base plate;

a first semiconductor construction which is arranged on the base plate and which has a plurality of external connection electrodes formed around an upper surface periphery;

a second semiconductor construction which is of a smaller size than the first semiconductor construction and which is provided in an inner area of an arrangement area of the external an connection electrodes above the first semiconductor construction;

an insulating layer formed around a periphery of the first semiconductor construction and the second semiconductor construction;

an upper layer insulating film formed on the first semiconductor construction, the second semiconductor construction and the insulating layer; and an upper layer wiring which is: (i) provided at least on the upper layer insulating film, (ii) electrically connected to the external connection electrodes of the first semiconductor construction, (iii) electrically connected to plural external connection electrodes of the second semiconductor construction, and (iv) extends to at least an area corresponding to the insulating layer formed around the periphery of the first semiconductor construction;

wherein each of the semiconductor constructions comprises columnar electrodes as the external connection electrodes; and a sealing film located between the columnar electrodes.

8. The semiconductor device according to claim 7, wherein each of the semiconductor constructions further comprises: (i) connection pads formed on a first surface of a semiconductor substrate, and (ii) a protective film which is formed on the first surface of the semiconductor substrate, which has openings that expose the connection pads, and which has wirings formed thereon that connect the connection pads with the columnar electrodes.

9. The semiconductor device according to claim 7, wherein the second semiconductor construction is directly mounted on the sealing film of the first semiconductor construction.

10. The semiconductor device according to claim 1, further comprising an overcoat film covering the upper layer wiring except for connection pads of the upper layer wiring.

11. The semiconductor device according to claim 10, wherein solder balls are arranged on the connection pads of the upper layer wiring.

12. The semiconductor device according to claim 1, wherein an adhesive layer for adhering the first and second semiconductor constructions is interposed between the first and second semiconductor constructions.

* * * * *

UNITED STATES PATENT AND TRADEMARK OFFICE
CERTIFICATE OF CORRECTION

PATENT NO.        : 7,550,833 B2
APPLICATION NO.   : 11/302593
DATED             : June 23, 2009
INVENTOR(S)       : Ichiro Mihara Page 1 of 1

It is certified that error appears in the above-identified patent and that said Letters Patent is hereby corrected as shown below:

Column 14, line 13 (Claim 7, line 10), delete "an".

Signed and Sealed this

Eighth Day of December, 2009

David J. Kappos
*Director of the United States Patent and Trademark Office*